United States Patent [19]

Okajima et al.

[11] Patent Number: 5,280,456
[45] Date of Patent: Jan. 18, 1994

[54] SEMICONDUCTOR MEMORY DEVICE ENABLING CHANGE OF OUTPUT ORGANIZATION WITH HIGH SPEED OPERATION

[75] Inventors: Yoshinori Okajima, Kawasaki; Yoshihide Sato, Tokorozawa; Shinnosuke Kamata, Kawasaki, all of Japan

[73] Assignee: Fujitsu Limited, Kawasaki, Japan

[21] Appl. No.: 944,953

[22] Filed: Sep. 15, 1992

[30] Foreign Application Priority Data

Sep. 20, 1991 [JP] Japan ................... 3-241043

[51] Int. Cl.$^5$ ............................... G11C 7/00
[52] U.S. Cl. ..................... 365/230.01; 365/189.01; 365/230.03
[58] Field of Search ............ 365/230.01, 230.02, 365/230.03, 207, 189.01, 189.02, 189.03, 189.05

[56] References Cited

U.S. PATENT DOCUMENTS

| | | | |
|---|---|---|---|
| 4,354,256 | 10/1982 | Miyasaka | 365/230.03 |
| 4,763,304 | 8/1988 | Uesugi | 365/189.08 |
| 4,907,203 | 3/1990 | Wada et al. | 365/230.03 |
| 4,985,867 | 1/1991 | Isuii et al. | 365/230.08 |
| 5,148,396 | 9/1992 | Nakada | 365/238.5 |
| 5,177,573 | 1/1993 | Ukita et al. | 365/189.05 |

FOREIGN PATENT DOCUMENTS 61-992  1/1986  Japan .
64-76486  3/1989  Japan .
2-282990  11/1990  Japan .

*Primary Examiner*—Eugene R. LaRoche
*Assistant Examiner*—Tan Nguyen
*Attorney, Agent, or Firm*—Staas & Halsey

[57] ABSTRACT

A semiconductor memory device enabling change of the output organization has a plurality of memory cell array portions each having a plurality of memory cells for storing data, a plurality of data buses for transferring data, a plurality of sense amplifiers for sensing data of a selected memory cell of the memory cell array portions, and a plurality of output gates connected to the sense amplifiers. At least two of the sense amplifiers are connected to each of the memory cell array portions through the data buses, respectively. The selection of the sense amplifiers is controlled to be activated or deactivated by control signals, to thereby change the output organization. Therefore, a delay in data transmission can be eliminated, and a high speed operation can be realized.

9 Claims, 6 Drawing Sheets

SEMICONDUCTOR MEMORY DEVICE ENABLING CHANGE OF OUTPUT ORGANIZATION WITH HIGH SPEED OPERATION

BACKGROUND OF THE INVENTION

1. Field of the Invention

The present invention relates to a semiconductor memory device, more particularly, to a semiconductor memory device enabling selection and change of the output organization.

2. Description of the Related Art

In recent years, various types of semiconductor memory devices have been developed and marketed in accordance with various requirements of users. Note, in the prior art, it requires a large amount of cost and a long period to develop new semiconductor memory devices, even when the differences between the new semiconductor memory devices differ only the output organizations (word-bit organizations) in the same memory matrix.

In the related art, there has been provided a semiconductor memory device enabling a reconfigurable organization, e.g., 4 mega word×1 bit (4M×1) and 1 mega word×4 bit (1M×4) organizations in a 4M-bit memory device. In this semiconductor memory device, the selection from the 4M×1 organization and the 1M×4 organization is carried out in accordance with the requirements organization in the manufacturing (maker side) or working stage (user side). Namely, this semiconductor memory device can be used both for ×1 and ×4 organizations without having to design and produce exclusive masks, wiring patterns, and the like. Therefore, the development period and required cost can be largely decreased.

In recent years, a capacity of a semiconductor memory device has been largely increased in accordance with improvements of semiconductor production technique, and the like. Therefore, a required time for testing the semiconductor memory device should be lengthened.

The semiconductor memory device enabling to select between the ×1 and ×4 organizations can realize to decrease the testing time by carrying out the memory test at ×4 organization. In this case, for instance, the semiconductor memory device is provided as a one-bit output organization memory device, and the four-bit output organization is electrically reconfigured for carrying out the memory test.

In the prior art, a semiconductor memory device enabling to set a one-bit output organization (×1 organization) and a four-bit output organization (×4 organization) of output data has been provided. However, in the prior art semiconductor memory device, switch units formed by MOS transistors are employed to change the output organization. Therefore, due to the ON resistance (turn-ON resistance) of the MOS transistors that form the switch units as well as wiring capacitance, the prior art semiconductor memory device has a large delay in data transmission, and thus a high speed operation (high speed reading) cannot be realized.

SUMMARY OF THE INVENTION

An object of the present invention is to provide a semiconductor memory device that selects and changes the output organization (word-bit organization), achieving a high speed operation.

According to the present invention, there is provided a semiconductor memory device enabling change of the output organization comprising a plurality of memory cell array portions each having a plurality of memory cells for storing data, a plurality of data buses for transferring data, a plurality of sense amplifiers for sensing data of a selected memory cell of the memory cell array portions, wherein at least two of the sense amplifiers are connected to each of the memory cell array portions through the data buses, respectively, and a plurality of output gates connected to the sense amplifiers, wherein the selection of the sense amplifiers is controlled to be activated or deactivated by control signals, to thereby change the output organization.

The sense amplifiers may comprise a plurality of first sense amplifiers connected to the corresponding output gates, and a plurality of second sense amplifiers connected to one output gate of the output gates through one-bit output organization data buses. The n-bit output organization may be selected and output through the output gates by selecting the first sense amplifiers to be activated, and the one-bit output organization may be selected and output through the one output gate by selecting the second sense amplifiers to be activated. Four output gates may be used, and the n-bit output organization may be a 4-bit output organization.

The sense amplifiers may comprise a plurality of first sense amplifiers connected to the corresponding output gates, and a plurality of second sense amplifiers, connected to the other output gates except for the corresponding output gates. The n-bit output organization may be selected and output through the output gates by only selecting the first sense amplifiers to be activated, and the complementary m-bit output organization may be selected and output through the output gates by selecting parts of the first and second sense amplifiers to be activated. Four output gates may be used, the n-bit output organization may be a 4-bit output organization, and the complementary m-bit output organization may be a complementary 2-bit output organization.

The memory cell array portions may comprise at least first and second memory cell array portions, the data buses may comprise at least first and second data buses corresponding to the memory cell array portions, the output gates may comprise at least first and second output gates corresponding to the memory cell array portions, the sense amplifiers comprise at least first, second, third and fourth amplifiers corresponding to the memory cell array portions, the first and second sense amplifiers may be connected to the first data bus, and the third and fourth sense amplifiers may be connected to the second data bus. Further, output terminals of the first and third sense amplifiers may be commonly connected to the first output gate, and output terminals of the second and fourth sense amplifiers may be connected to the first and second output gates, and a first mode of the output organization of output data may be achieved by activating the first sense amplifier while deactivating the second, third, and fourth sense amplifiers, or by activating the third sense amplifier while deactivating the first, second, and fourth sense amplifiers, and a second mode of the output organization of output data may be achieved by deactivating the first and third sense amplifiers while activating the second and fourth sense amplifiers.

The memory cell array portions may comprise at least first and second memory cell array portions, the data buses may comprise at least first and second data buses corresponding to the memory cell array portions, the output gates may comprise at least first and second output gates corresponding to the memory cell array portions, the sense amplifiers may comprise at least first, second, third and fourth amplifiers corresponding to the memory cell array portions. Further, the first and second sense amplifiers may be connected to the first data bus, and the third and fourth sense amplifiers may be connected to the second data bus, positive-phase and negative-phase signal output terminals of the second sense amplifier may be connected to positive-phase and negative-phase signal input terminals of the first output gate, positive-phase and negative-phase signal output terminals of the third sense amplifier may be connected to the negative-phase and positive-phase signal input terminals of the first output gate, positive-phase and negative-phase signal output terminals of the fourth sense amplifier may be connected to positive-phase and negative-phase signal input terminals of the second output gate, and positive-phase and negative-phase signal output terminals of the first sense amplifier may be connected to the negative-phase and positive-phase signal input terminals of the second output gate, and a first mode of the output organization of output data may be achieved by activating the first and second sense amplifiers while deactivating the third and fourth sense amplifiers, or by deactivating the first and second sense amplifiers while activating the third and fourth sense amplifiers, a second mode of the output organization of output data may be achieved by deactivating the first and third sense amplifiers while activating the second and fourth sense amplifiers.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments, the problems of the prior art will be explained with reference to FIGS. 1 to 3.

Figure 1:
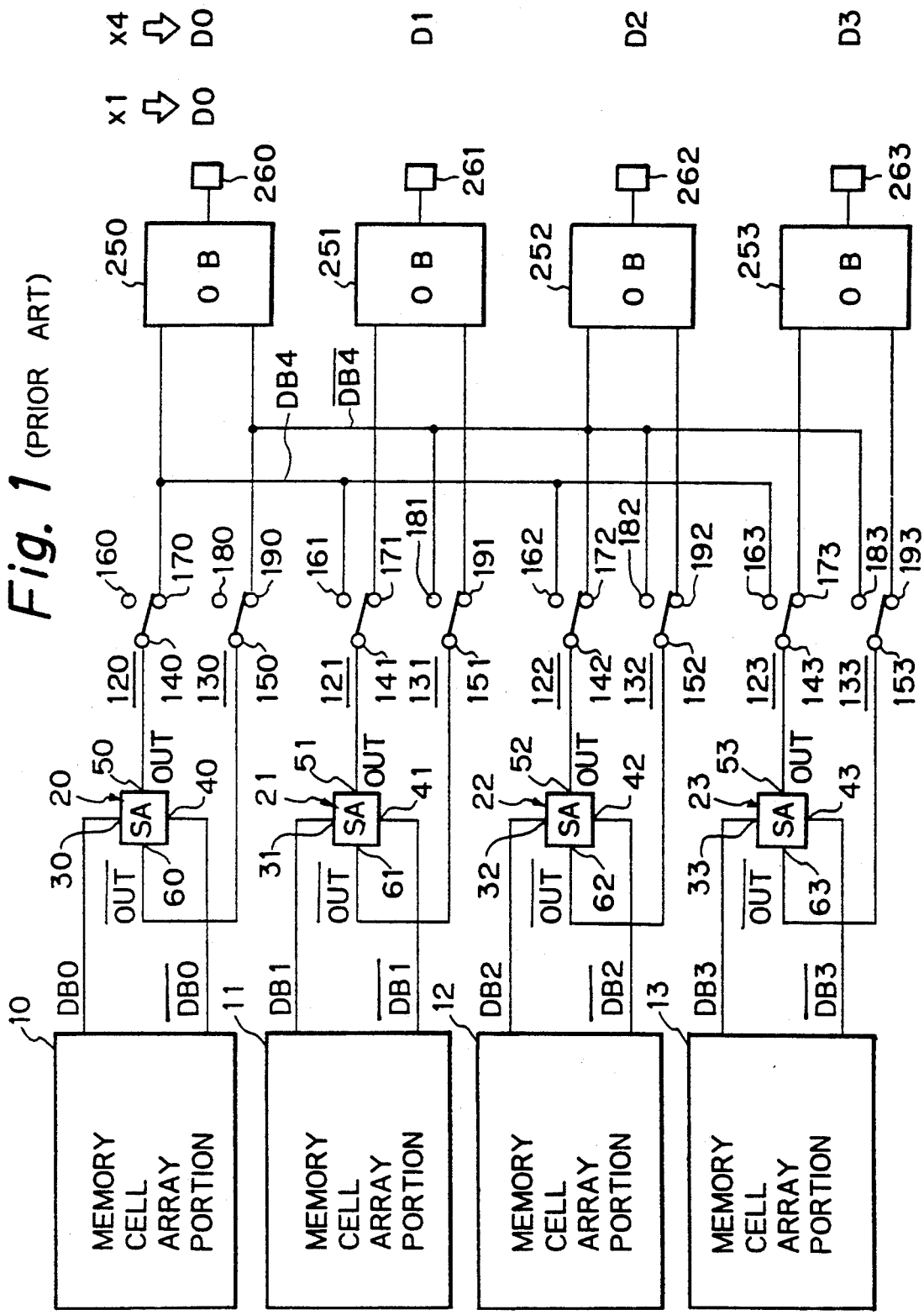
FIG. 1 is a circuit diagram showing an essential part of an example of a semiconductor memory device according to the prior art.

FIG. 1 shows an essential part of an example of a semiconductor memory. device according to the prior art. Note, this semiconductor memory device is capable of selecting a one-bit output organization (×1 organization) or a four-bit output organization (×4 organization) for output data.

Note, the selection between the ×1 and ×4 organizations is carried out in accordance with the required organization in a manufacturing stage or working stage (user level). Namely, this semiconductor memory device can be used for both one-bit word and four-bit output organization memory devices without designing and producing exclusive masks or wiring patterns, and the like. Therefore, the development period and required cost can be largely decreased. Further, the semiconductor memory device enabling a selection between the ×1 and ×4 organizations can realize a decrease in the testing time by carrying out the memory test at ×4 organization. In this case, the semiconductor memory device is provided as a one-bit output organization memory device, and the four-bit output organization is only selected for carrying out the memory test.

In FIG. 1, reference numerals 10 to 13 denote memory cell array portions each having the same number of memory cells, and DB0 and /DB0 to DB3 and /DB3 are data buses connected to corresponding memory cell array portions 10 to 13. Further, reference numerals 20 to 23 denote sense amplifiers connected to the corresponding memory cell array portions 10 to 13 through the data buses DB0 and /DB0 to DB3 and /DB3, 30 to 33 and 40 to 43 are input terminals, and 50 to 53 and 60 to 63 are output terminals of the sense amplifiers 20 to 23.

The output terminals 50 to 53 are positive-phase signal output terminals that provide signals having the same phases as those of signals provided to the input terminals 30 to 33 respectively of the sense amplifiers 20 to 23 respectively. Conversely, the output terminals 60 to 63 are negative-phase signal output terminals that provide signals having the opposite phases to those of signals received by the input terminals 30 to 33 respectively of the sense amplifiers 20 to 23 respectively.

Figure 2:
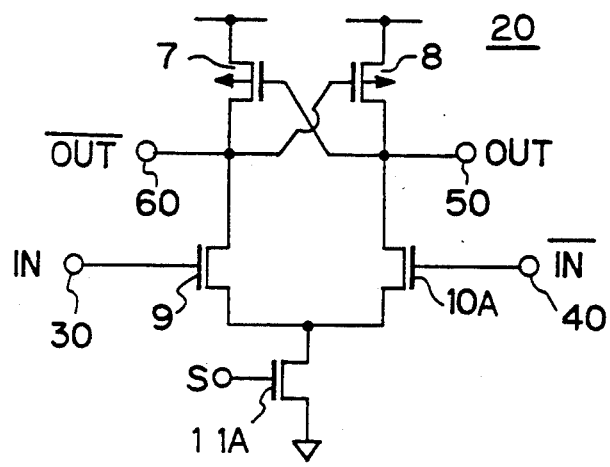
FIG. 2 is a circuit diagram showing a sense amplifier of the semiconductor memory device shown in FIG. 1.

FIG. 2 shows a sense amplifier 20 of the semiconductor memory device shown in FIG. 1. Note, the sense amplifiers 20 to 23 have the same configuration.

In FIG. 2, reference numerals 7 and 8 denote P-channel type MOS transistors used for load transistors, 9 and 10A denote N-channel type MOS transistors used for drive transistors, and 11A denotes an N-channel type MOS transistor used for a constant current source. Further, reference S denotes a control signal for switching ON and OFF the transistor 11A to activate and deactivate the sense amplifier 20.

Returning to FIG. 1, reference numerals 120 to 123 and 130 to 133 denote switch units, 140 to 143 and 150 to 153 denote movable contacts, and 160 to 163, 170 to 173, 180 to 183, and 190 to 193 are fixed contacts.

Figure 3:
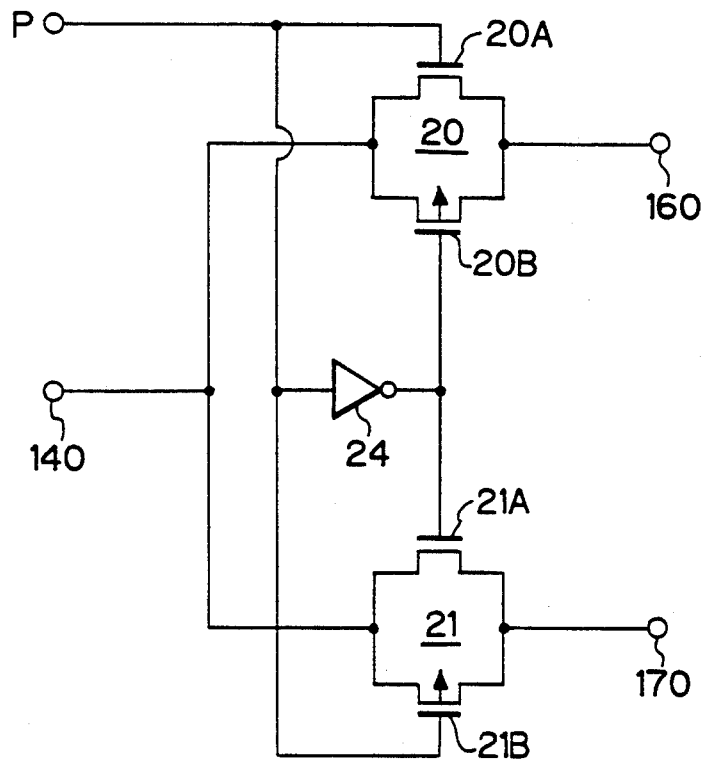
FIG. 3 is a circuit diagram showing a switch unit of the semiconductor memory device shown in FIG. 1.

FIG. 3 shows a switch unit of the semiconductor memory device shown in FIG. 1. Note, the switch units 120 to 123 and 130 to 133 have the same configuration.

In FIG. 3, reference numerals 20 and 21 denote analog switches, 20A and 21A denote N-channel type MOS transistors, 20B and 21B denote P-channel type MOS transistors, and 24 denotes an inverter. Further, reference P denotes a control signal for switching ON and OFF the analog switches 20 and 21.

To return again in FIG. 1, references DB4 and /DB4 denote data buses, and reference numerals 250 to 253 denote output buffers (output gates) which have the same configuration as, for example, the sense amplifiers 20 to 23. Further, reference numerals 260 to 263 denote output terminals, and D0 to D3 are data provided from the output terminals 260 to 263. When the output organization is required to be a one-bit output organization (×1 organization), the semiconductor memory device provides only the data D0 to the output terminal 260. On the other hand, when the output organization is required to be a four-bit output organization (×4 organization), the semiconductor memory device provides the data D0 to D3 to the output terminals 260 to 263, respectively.

When the output organization is of a one-bit output organization, the semiconductor memory device uses the memory cell array portions 10 to 13 as a single memory cell array from which it selects one memory cell. In this case, a sense amplifier corresponding to the memory cell array portion that includes the selected memory cell and the output buffer 250 are activated and connected to each other through the switch units.

For example, when a memory cell in the memory cell array portion 10 is selected, the sense amplifier 20 corresponding to the memory cell array portion 10 is activated and the other sense amplifiers 21 to 23 are deactivated. In this case, the movable contacts 140 and 150 of the switch units 120 and 130 are connected to the fixed contacts 170 and 190, respectively, in order for the data of the selected memory cell in the memory cell array portion 10 to be output through the output buffer 250 to the output terminal 260. Similarly, for example, when a memory cell in the memory cell array portion 11 is selected, the sense amplifier 21 corresponding to the memory cell array portion 11 is activated and the other sense amplifiers 20, 22 and 23 are deactivated. In this case, the movable contacts 141 and 151 of the switch units 121 and 131 are connected to the fixed contacts 161 and 181, respectively, in order for the data of the selected memory cell in the memory cell array portion 11 to be output through the data buses DB4 and /DB4 and the output buffer 250 to the output terminal 260.

On the other hand, when the output organization is of a four-bit output organization, one memory cell is selected from each of the memory cell array portions 10 to 13, and all of the sense amplifiers 30 to 33 are activated. In this case, the movable contacts 140 to 143 of the switch units 120 to 123, respectively are connected to the fixed contacts 170 to 173 respectively, and the movable contacts 150 to 153 of the switch units 130 to 133, respectively are connected to the fixed contacts 190 to 193, respectively so that the data of each selected memory cell in the memory cell array portions 10 to 13 are output from the output terminals 260 to 263 through the output buffers 250 to 253, respectively.

In the above described semiconductor memory device, the switch units 120 to 123 and 130 to 133 for changing the output organization should be provided. Therefore, due to the ON resistance of the MOS transistors that form the switch units 120 to 123 and 130 to 133 as well as wiring capacitance, the prior art semiconductor memory device has a large delay in data transmission, and thus a high speed operation (high speed reading) cannot be realized.

Below, the preferred embodiments of a semiconductor memory device according to the present invention, will be explained with reference to FIGS. 4 to 7.

Figure 4:
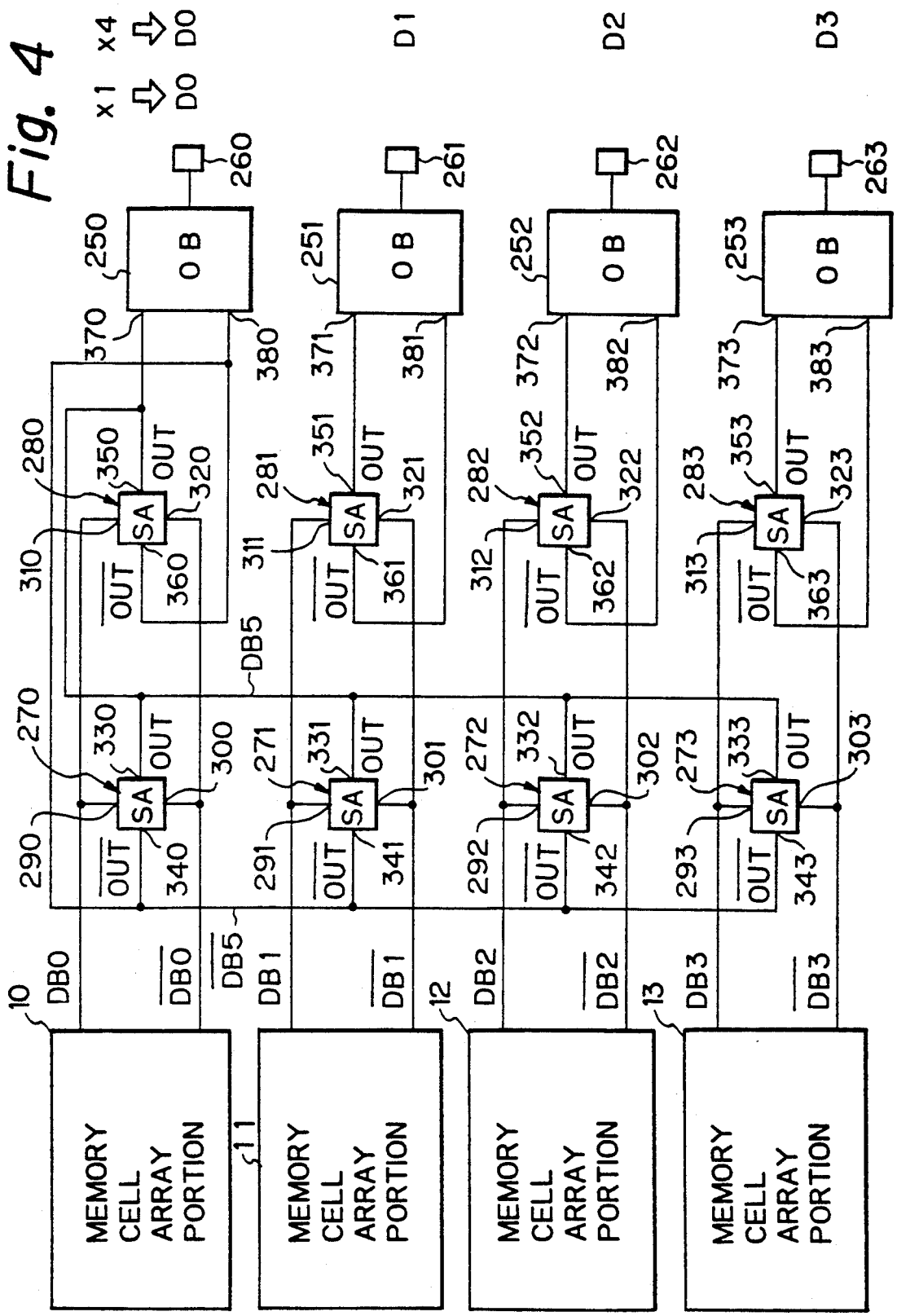
FIG. 4 is a circuit diagram showing an essential part of an embodiment of a semiconductor memory device according to the present invention.

FIG. 4 shows an essential part of an embodiment of a semiconductor memory device according to the present invention. Note, in FIG. 4, portions corresponding to those shown in FIG. 1 are represented by the same numerals. Further, the semiconductor memory device shown in FIG. 4 is capable of selecting a one-bit output organization (×1 organization) or a four-bit output organization (×4 organization) for output data. In addition, the present embodiment can be applied to various types of exclusive semiconductor memory devices (for example, SRAM devices, DRAM devices), one-chip microprocessors having semiconductor memory devices, and the like.

In FIG. 4, reference numerals 10 to 13 denote memory cell array portions each having the same number of memory cells, and DB0 and /DB0 to DB3 and /DB3 are data buses connected to corresponding memory cell array portions 10 to 13. Further, reference numerals 250 to 253 denote output buffers (output gates), 260 to 263 denote output terminals, and D0 to D3 are data provided from the output terminals 260 to 263, respectively. When the output organization (word-bit organization) is required to be a one-bit output organization (×1 organization), the semiconductor memory device provides only the data D0 to the output terminal 260. On the other hand, when the output organization is required to be a four-bit output organization (×4 organization), the semiconductor memory device provides the data D0 to D3 to the output terminals 260 to 263, respectively. Note, these configurations are the same as that of the semiconductor memory device shown in FIG. 1.

Further, in FIG. 4, reference numerals 270 to 273 are sense amplifiers that are used when the output organization is of one bit (one-bit output organization), and 280 to 283 are sense amplifiers that are used when the output organization is of four bits (four-bit output organization). In the sense amplifiers 270 to 273 and 280 to 283, reference numerals 290 to 293, 300 to 303, 310 to 313, and 320 to 323 are input terminals, and 330 to 333, 340 to 343, 350 to 353, and 360 to 363 are output terminals.

The output terminals 330 to 333 are positive-phase signal output terminals that provide signals having the same phases as those of signals received by the input terminals 290 to 293. The output terminals 340 to 343 are negative-phase signal output terminals that provide signals having the opposite phases to those of signals received by the input terminals 290 to 293.

Similarly, the output terminals 350 to 353 are positive-phase signal output terminals that provide signals having the same phases as those of signals received by the input terminals 310 to 313. The output terminals 360 to 363 are negative-phase signal output terminals that provide signals having the opposite phases to those of signals received by the input terminals 310 to 313. Note, the sense amplifiers 270 to 273 and 280 to 283 have the same structure as, for example, the sense amplifier 20 shown in FIG. 2.

In FIG. 4, reference numerals 370 to 373 and 380 to 383 are input terminals of the output buffers 250 to 253. The output terminals 260 to 263 provide signals having the same phases as those of signals received by the input terminals 370 to 373. Namely, the input terminals 370 to 373 are positive-phase signal input terminals, and the input terminals 380 to 383 are negative-phase signal input terminals.

The positive-phase signal output terminals 330 to 333 and negative-phase signal output terminals 340 to 343 of the sense amplifiers 270 to 273 are connected to the positive-phase signal input terminal 370 and negative-phase signal input terminal 380 of the output buffer 250 through data buses DB5 and /DB5, respectively.

The positive-phase signal output terminals 350 to 353 and negative-phase signal output terminals 360 to 363 of the sense amplifiers 280 to 283 are connected to the output buffers 250 to 253, respectively. The other configurations of this semiconductor memory device shown in FIG. 4 are the same as those of the prior art semiconductor memory device shown in FIG. 1.

When the output organization is of a one-bit output organization, the semiconductor memory device uses the memory cell array portions 10 to 13 as a single memory cell array from which it selects one memory cell. In this case, only one of the sense amplifiers 270 to 273 corresponding to the memory cell array portion that includes the selected memory cell is activated, and the output buffer 250 is activated so that data of the selected memory cell is provided to the output terminal 260.

For example, when a memory cell in the memory cell array portion 10 is selected, the sense amplifier 270 corresponding to the memory cell array portion 10 is activated and the other sense amplifiers 271 to 273 and 280 to 283 are deactivated. In this case, only one output buffer 250 is activated, and the data of the selected memory cell in the memory cell array portion 10 are output from the output terminal 260 through the output buffer 250. Similarly, for example, when a memory cell in the memory cell array portion 11 is selected, the sense amplifier 271 corresponding to the memory cell array portion 11 is activated and the other sense amplifiers 270, 272 and 273 and 280 to 283 are deactivated. In this case, only one output buffer 250 is activated, and the data of the selected memory cell in the memory cell array portion 11 are output from the output terminal 260 through the output buffer 250.

On the other hand, when the output organization is of a four-bit output organization, one memory cell is selected from each of the memory cell array portions 10 to 13, the sense amplifiers 270 to 273 are deactivated, the sense amplifiers 280 to 283 are activated, and the output buffers 250 to 253 are activated.

As described above, in the embodiment of the semiconductor memory device shown in FIG. 4, the output organization (word-bit organization) is changed between one bit (one-bit output organization) and four bits (four-bit output organization) without employing switches but by activating and deactivating the sense amplifiers 270 to 273 and 280 to 283. Therefore, a delay in data transmission that is caused by such switches can be eliminated, and a high speed reading (high speed operation) can be realized.

Figure 5:
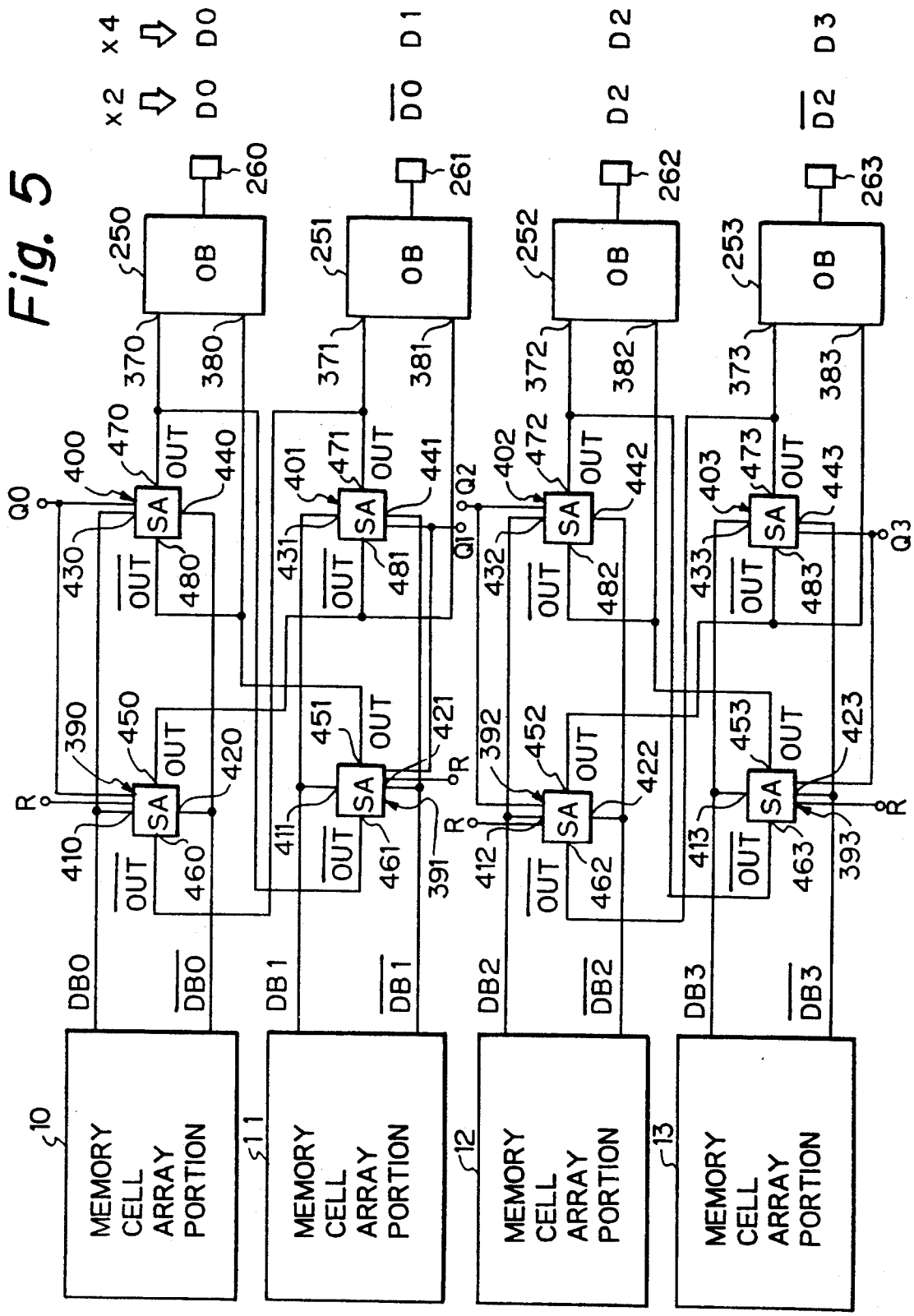
FIG. 5 is a circuit diagram showing an essential part of another embodiment of a semiconductor memory device according to the present invention.

FIG. 5 shows an essential part of another embodiment of a semiconductor memory device according to the present invention. Note, in FIG. 5, portions corresponding to those shown in FIGS. 1 and 4 are represented by the same numerals. Further, the semiconductor memory device shown in FIG. 5 is capable of selecting a complementary two-bit output organization (×2 organization) or a four-bit output organization (×4 organization) for output data. Note, the complementary two-bit output organization includes not only two-bit data from a memory cell but also inverted data of the two-bit data.

In FIG. 5, reference numerals 10 to 13 denote memory cell array portions each having the same number of memory cells, and DB0 to /DB0 to DB3 and /DB3 are data buses connected to corresponding memory cell array portions 10 to 13. Further, reference numerals 250 to 253 denote output buffers, 260 to 263 denote output terminals, and DO to D3 are data provided from the output terminals 260 to 263. When the complementary two-bit output organization is selected for output data, this embodiment provides data D0, /D0, D2, and /D2 to output terminals 260, 261, 262, and 263, respectively. When the four-bit output organization is selected for output data, the embodiment provides data D0, D1, D2, and D3 to the output terminals 260, 261, 262, and 263, respectively.

Further, in FIG. 5, reference numerals 390 to 393 and 400 to 403 are sense amplifiers. In these sense amplifiers, reference numerals 410 to 413, 420 to 423, 430 to 433, and 440 to 443 are input terminals, and 450 to 453, 460 to 463, 470 to 473, and 480 to 483 are output terminals.

The output terminals 450 to 453 are positive-phase signal output terminals that provide signals having the same phases as those of signals received by the input terminals 410 to 413. The output terminals 460 to 463 are negative-phase signal output terminals that provide signals having the opposite phases to those of signals received by the input terminals 410 to 413. The output terminals 470 to 473 are positive-phase signal output terminals that provide signals having the same phases as those of signals received by the input terminals 430 to 433. The output terminals 480 to 483 are negative-phase signal output terminals that provide signals having the opposite phases to those of signals received by the input terminals 430 to 433.

The positive-phase signal output terminal 450 and negative-phase signal output terminal 460 of the sense amplifier 390 are connected to the negative-phase signal input terminal 381 and positive-phase signal input terminal 371 of the output buffer 251, respectively. The positive-phase signal output terminal 451 and negative-phase signal output terminal 461 of the sense amplifier 391 are connected to the negative-phase signal input terminal 380 and positive-phase signal input terminal 370 of the output buffer 250, respectively.

Similarly, the positive-phase signal output terminal 452 and negative-phase signal output terminal 462 of the sense amplifier 392 are connected to the negative-phase signal input terminal 383 and positive-phase signal input terminal 373 of the output buffer 253, respectively. The positive-phase signal output terminal 453 and negative-phase signal output terminal 463 of the sense amplifier 393 are connected to the negative-phase signal input terminal 382 and positive-phase signal input terminal 372 of the output buffer 252, respectively.

The positive-phase signal output terminal 470 and negative-phase signal output terminal 480 of the sense amplifier 400 are connected to the positive-phase signal input terminal 370 and negative-phase signal input terminal 380 of the output buffer 250, respectively. The positive-phase signal output terminal 471 and negative-phase signal output terminal 481 of the sense amplifier 401 are connected to the positive-phase signal input terminal 371 and negative-phase signal input terminal 381 of the output buffer 251, respectively.

Similarly, the positive-phase signal output terminal 472 and negative-phase signal output terminal 482 of the sense amplifier 402 are connected to the positive-phase signal input terminal 372 and negative-phase signal input terminal 382 of the output buffer 252, respectively. The positive-phase signal output terminal 473 and negative-phase signal output terminal 483 of the sense amplifier 403 are connected to the positive-phase signal input terminal 373 and negative-phase signal input terminal 383 of the output buffer 253, respectively.

Figure 6:
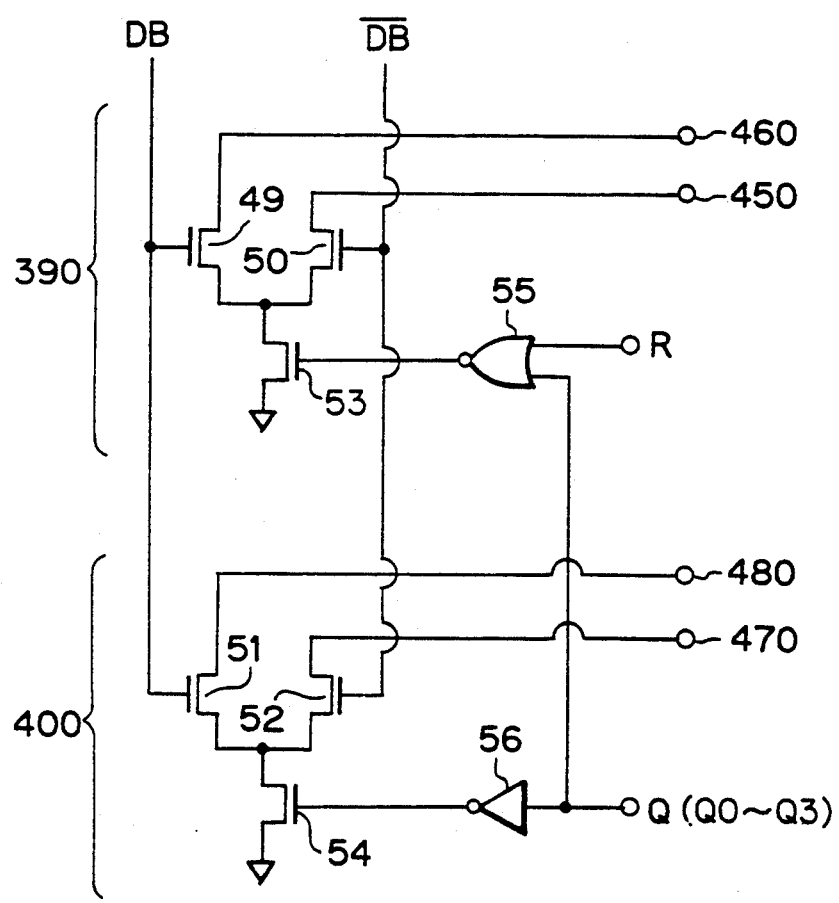
FIG. 6 is a circuit diagram showing sense amplifiers of the semiconductor memory device shown in FIG. 5.

FIG. 6 shows sense amplifiers of the semiconductor memory device shown in FIG. 5. Note, the, sense amplifiers 390 to 393 have the same structure and the sense amplifiers 400 to 403 have the same structure, and FIG. 6 shows the sense amplifiers 390 and 400 as typical examples.

In FIG. 6, reference numerals 49 to 52 denote N-channel type MOS transistors used for drive transistors, 53 and 54 denotes N-channel type MOS transistors used for constant current sources, 55 denotes a NOR gate, and 56 denotes an inverter. Further, references Q (Q0 to Q3) and R denote control signals (mode control signals).

The control signal Q is set to a low level "L" to activate the sense amplifiers 390 and 400, and to a high level "H" to deactivate the sense amplifiers 390 and 400. The control signal R is set to a low level "L" to select the complementary two-bit output organization for output data, and to a high level "H" to select the four-bit output organization for output data. Note, as shown in FIG. 6, the sense amplifier 400 is activated when the control signal Q is set to a low level "L", and the sense amplifier 390 is activated when the control signal Q and R are set to low levels "L". Further, these control signals R and Q can be applied not only from the external, but also the control signals R and Q can be generated by using various signals, for example, address signals, and the like.

When the semiconductor memory device shown in FIG. 5 reads data of memory cells of the memory cell array portions 10 and 12 with the complementary two-bit output organization for output data, the control signal R and the control signals Q0, Q2 are brought to low levels "L" and the control signals Q1, Q3 are brought to high levels "H", so that the sense amplifiers 390 and 400 are activated, the sense amplifiers 391 and 401 are deactivated, the sense amplifiers 392 and 402 are activated, and the sense amplifiers 393 and 403 are deactivated. Note, the output buffers 250 to 253 are also activated.

In this case, the same data from the memory cell array portion 10 is provided to the sense amplifiers 390 and 400 with the same phase. Since the positive-phase signal output terminal 450 and negative-phase signal output terminal 460 of the sense amplifier 390 are connected to the negative-phase signal input terminal 381 and positive-phase signal input terminal 371 of the output buffer 251, respectively, and further the positive-phase signal output terminal 470 and negative-phase signal output terminal 480 of the sense amplifier 400 are connected to the positive-phase signal input terminal 370 and negative-phase signal input terminal 380 of the output buffer 250, respectively, data of the memory cell of the memory cell array portion 10 is read out to the output terminal 260, and a signal having the opposite phase to that of the read data is provided to the output terminal 261.

Similarly, the same data from the memory cell array portion 12 is provided to the sense amplifiers 392 and 402 with the same phase. Since the positive-phase signal output terminal 452 and negative-phase signal output terminal 462 of the sense amplifier 392 are connected to the negative-phase signal input terminal 383 and positive-phase signal input terminal 373 of the output buffer 253, respectively, and further the positive-phase signal output terminal 472 and negative-phase signal output terminal 482 of the sense amplifier 402 are connected to the positive-phase signal input terminal 372 and negative-phase signal input terminal 382 of the output buffer 252, respectively, data of the memory cell of the memory cell array portion 12 is read out to the output terminal 262, and a signal having the opposite phase to that of the read data is provided to the output terminal 263.

Next, when reading data of memory cells of the memory cell array portions 11 and 13 with the complementary two-bit output organization for output data, the control signal R and the control signals Q1, Q3 are brought to low levels "L" and the control signals Q0, Q2 are brought to high levels "H", so that the sense amplifiers 390 and 400 are deactivated, the sense amplifiers 391 and 401 are activated, the sense amplifiers 392 and 402 are deactivated, and the sense amplifiers 393 and 403 are activated. Note, the output buffers 250 to 253 are also activated.

In this case, the same data from the memory cell array portion 11 is provided to the sense amplifiers 391 and 401 with the same phase. Since the positive-phase signal output terminal 451 and negative-phase signal output terminal 461 of the sense amplifier 391 are connected to the negative-phase signal input terminal 380 and positive-phase signal input terminal 370 of the output buffer 250, respectively, and further the positive-phase signal output terminal 471 and negative-phase signal output terminal 481 of the sense amplifier 401 are connected to the positive-phase signal input terminal 371 and negative-phase signal input terminal 381 of the output buffer 251, respectively, data of the memory cell of the memory cell array portion 11 is read out to the output terminal 261, and a signal having the opposite phase to that of the read data is provided to the output terminal 260.

Similarly, the same data from the memory cell array portion 13 is provided to the sense amplifiers 393 and 403 with the same phase. Since the positive-phase signal output terminal 453 and negative-phase signal output terminal 463 of the sense amplifier 393 are connected to the negative-phase signal input terminal 382 and positive-phase signal input terminal 372 of the output buffer 252, respectively, and further the positive-phase signal output terminal 473 and negative-phase signal output terminal 483 of the sense amplifier 403 are connected to the positive-phase signal input terminal 373 and negative-phase signal input terminal 383 of the output buffer 253, respectively, data of the memory cell of the memory cell array portion 13 is read out to the output terminal 263, and a signal having the opposite phase to that of the read data is provided to the output terminal 262.

Further, when reading data of memory cells of the memory cell array portions 10 and 13 with the complementary two-bit output organization for output data, the control signal R and the control signals Q0, Q3 are brought to low levels "L" and the control signals Q1, Q2 are brought to high levels "H", so that the sense amplifiers 390 and 400 are activated, the sense amplifiers 391 and 401 are deactivated, the sense amplifiers 392 and 402 are deactivated, and the sense amplifiers 393 and 403 are activated. When reading data of memory cells of the memory cell array portions 11 and 12 with the complementary two-bit output organization for output data, the control signal R and the control signal Q1, Q2 are brought to low levels "L" and the control signals Q0, Q3 are brought to high levels "H". so that the sense amplifiers 390 and 400 are deactivated, the sense amplifiers 391 and 401 are activated, the sense amplifiers 392 and 402 are activated, and the sense amplifiers 393 and 403 are deactivated. Note, in the above two cases, the output buffers 250 to 253 are also activated.

On the other hand, when the output organization is of a four-bit output organization, the control signal R is brought to a high level "H" and the control signals Q0 to Q3 are brought to low levels "L", so that the sense amplifiers 390 to 393 are deactivated, the sense amplifiers 400 to 403 are activated, and the output buffers 250 to 253 are activated. Therefore, data of memory cells of the memory cell array portions 10 to 13 are provided through the sense amplifiers 400 to 403 and output buffers 250 to 253, respectively.

As described above, in the embodiment of the semiconductor memory device shown in FIG. 5, the output organization is changed between two bits (complementary two-bit output organization) and four bits (four-bit output organization) without employing switches but by activating and deactivating the sense amplifiers 390 to 393 and 400 to 403. Therefore, a delay in data transmission that is caused by such switches can be eliminated, and a high speed operation can be realized.

Figure 7:
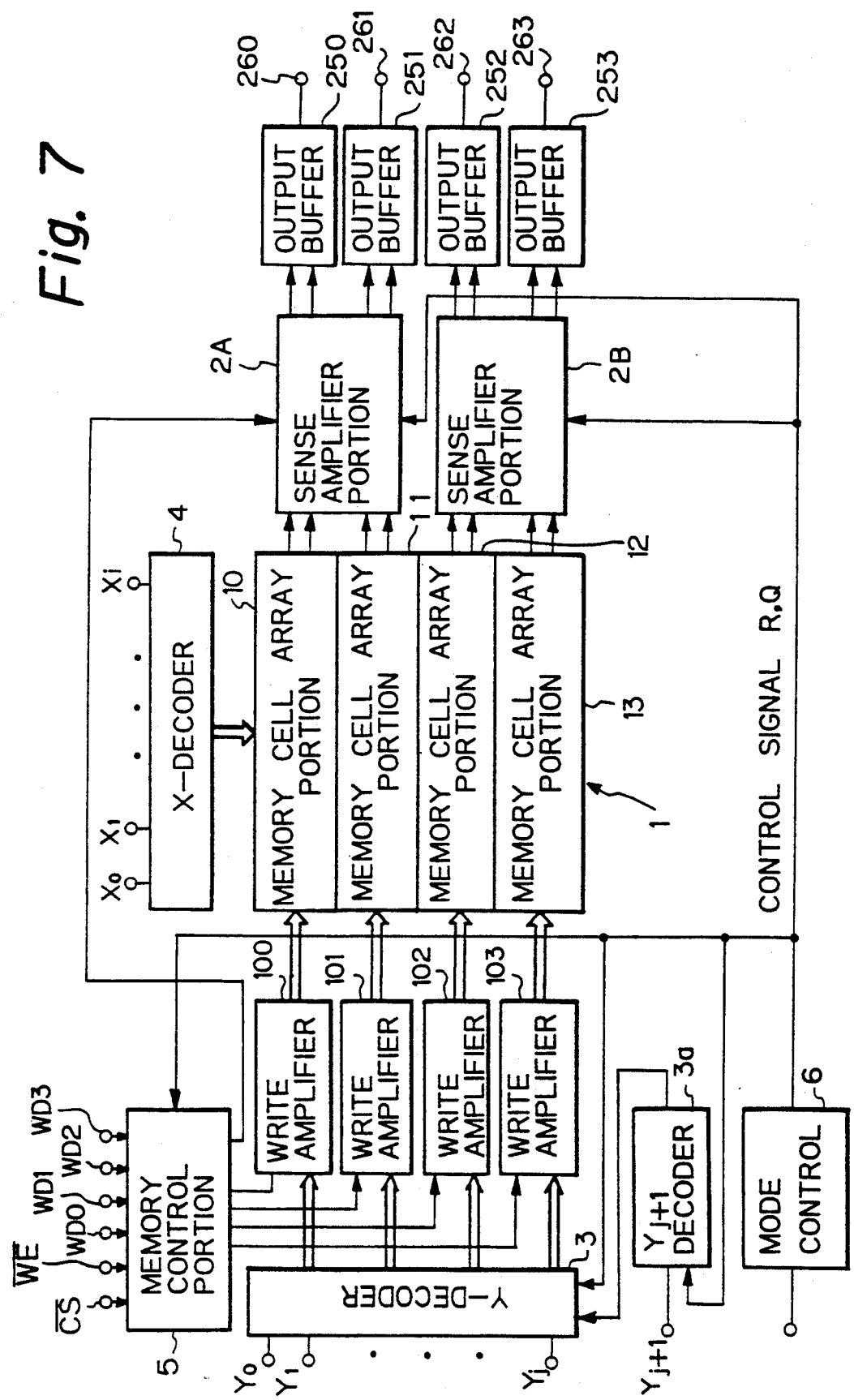
FIG. 7 is a block diagram showing the overall configuration of a semiconductor memory device according to the present invention.

FIG. 7 shows the overall configuration of an SRAM device applying the embodiment shown in FIG. 5. In FIG. 5, reference numeral 1 denotes a memory cell array, 2A and 2B denote sense amplifier portions, 3 denotes a Y-decoder, and 3A denotes a Yj+1 decoder. Further, reference numeral 4 denotes an X-decoder, 5 denotes a memory control portion, 6 denotes a mode control portion .

With reference to FIGS. 5 and 7, the memory cell array 1 includes the memory cell array portions 10 to 13, the sense amplifier portion 2A includes the sense amplifiers 390, 391, 400 and 401, and the sense amplifier portion 2B includes the sense amplifiers 392, 393, 402 and 403. Note, in general, the memory cell array 1 is not physically divided, but logically divided as the memory cell array portions 10 to 13.

The X-decoder 4 receives X-addresses X0 to Xi and is used to select a specific line (word line) in the memory cell array I in accordance with the X-addresses, and the Y-decoder 3 receives Y-addresses Y0 to Yj and used to select a specific line (bit lines corresponding to complementary data buses) in the memory cell array 1 through the write amplifiers 100 to 103 in accordance with the Y-addresses. The write amplifiers 100 to 103 also receive write data from the memory control portion 5 and write the data to a specific memory cell determined by the selected word line and bit lines. The memory control portion 5 receives a chip select signal /CS, write enable signal /WE, and write data signals WD0 to WD3, and is used to control the SRAM between reading or writing states.

The mode control portion 6 outputs control signals (mode control signals) R and Q to the Y-decoder 3, the Yj+1 decoder 3A, the memory control portion 5, and sense amplifier portions 2A and 2B. The mode control portion 6 receives a mode signal for changing the output organization between a complementary 2-bit output organization (×2 organization) and a 4-bit output organization (×4 organization) from the external through a mode pin (I/O pin). Note, in the case that the SRAM is used as a 4-bit output organization, four I/O pins for receiving 4-bit write data WD0 to WD3 are necessary.

On the other hand, in the case that the SRAM is used as a complementary 2-bit output organization, only two I/O pins for receiving 2-bit write data WD0 and WD1 and an I/O pin for receiving an address signal Yj+1 are necessary, and the other two I/O pins (WD2 and WD3) are not necessary. Therefore, in the case that the SRAM is used as a complementary 2-bit output organization, the two I/O pins, which are used as I/O pins for receiving write data WD2 and WD3 of the 4-bit output organization SRAM, can be used as the I/O pin for receiving the address signal Yj+1 and the I/O pin for receiving the mode signal from the external.

In the above description, the sense amplifier portions 2A and 2B (sense amplifiers 390 to 393 and 400 to 403) are activated or deactivated by the control signals R and Q (Q0 to Q3), which are described in detail with reference to FIGS. 5 and 6. The sense amplifiers 2A and 2B are also controlled (activated or deactivated) by the output signal of the memory control portion 5.

Note, the semiconductor memory device according to the present invention can be applied not only to an SRAM device, but also various types of exclusive semiconductor memory devices (for example, DRAM devices) or one-chip microprocessors having semiconductor memory devices, and the like.

As described above, the present invention changes the output organization without employing switches but by activating and deactivating a plurality of sense amplifiers. Consequently, the present invention eliminates a delay in data transmission that may be caused by such switches, and realizes a high speed operation (high speed reading) can be realized.

Many widely differing embodiments of the present invention may be constructed without departing from the spirit and scope of the present invention, and it should be understood that the present invention is not limited to the specific embodiments described in this specification, except as defined in the appended claims.

We claim:

1. A semiconductor memory device which stores data and outputs a selectable one of plural, different output organizations of the data in accordance with corresponding control signals supplied to said semiconductor memory device, said semiconductor memory device comprising:

a plurality of memory cell array portions, each said memory cell array portion comprising a plurality of memory cells for storing data;

a plurality of data buses for transferring data;

a plurality of sense amplifiers for sensing data of selected memory cells of said memory cell array portions, wherein each said memory cell array portion is respectively associated with at least two of said sense amplifiers and connected to said respectively associated at least two of said sense amplifiers through respectively corresponding said data buses; and a plurality of output gates, each said output gate being associated with and connected to at least one respective said sense amplifier through at least one said data bus, wherein each said sense amplifier is controlled to a selected one of activated and deactivated states by at least one of said control signals, to thereby select said plural and different output organizations.

2. A semiconductor memory device as claimed in claim 1, wherein said plurality of sense amplifiers comprises:

a plurality of first sense amplifiers connected to corresponding said output gates through a plurality of corresponding said data buses; and a plurality of second sense amplifiers connected to one output gate of said output gates through a common said data bus.

3. A semiconductor memory device as claimed in claim 2, wherein an n-bit output organization is selected and output through n said output gates by controlling said first sense amplifiers to said activated state, and a one-bit output organization is selected and output through said one output gate by controlling said second sense amplifiers to said activated state.

4. A semiconductor memory device as claimed in claim 3, wherein said n-bit organization is a 4-bit output organization selected and output through four said output gates.

5. A semiconductor memory device as claimed in claim 1, wherein said plurality of sense amplifiers comprises:

a plurality of first sense amplifiers connected to corresponding said output gates of said plurality of output gates; and a plurality of second sense amplifiers, each said second sense amplifier respectively associated with a corresponding first sense amplifier and connected to one of said output gates different from said corresponding output gate of said corresponding first sense amplifier.

6. A semiconductor memory device as claimed in claim 5, wherein an n-bit output organization is selected and output through n said corresponding output gates by controlling said first sense amplifiers to the activated state, and a complementary m-bit output organization is selected and output through said output gates by controlling only various ones of said plurality of first sense amplifiers and respectively associated corresponding second sense amplifiers to the activated state.

7. A semiconductor memory device as claimed in claim 6, wherein four output gates are used, said n-bit output organization is a 4-bit output organization, and said complementary m-bit output organization is a complementary 2-bit output organization.

8. A semiconductor memory device as claimed in claim 1, wherein:

said memory cell array portions comprise at least first and second memory cell array portions;

said data buses comprise at least first and second data buses corresponding to said memory cell array portions;

said output gates comprise at least first and second output gates corresponding to said memory cell array portions;

said sense amplifiers comprise at least first, second, third and fourth sense amplifiers corresponding to said memory cell array portions;

said first and second sense amplifiers are connected to said first data bus, and said third and fourth sense amplifiers are connected to said second data bus; and output terminals of said first and third sense amplifiers are commonly connected to said first output gate, and output terminals of said second and fourth sense amplifiers are commonly connected to said first and second output gates;

a first mode of said output organization of output data is achieved by one of activating said first sense amplifier while deactivating said second, third, and fourth sense amplifiers, and activating said third sense amplifier while deactivating said first, second, and fourth sense amplifiers, and a second mode of said output organization of output data is achieved by deactivating said first and third sense amplifiers while activating said second and fourth sense amplifiers.

9. A semiconductor memory device as claimed in claim 1, wherein:

said memory cell array portions comprise at least first and second memory cell array portions;

said data buses comprise at least first and second data buses corresponding to said memory cell array portions;

said output gates comprise at least first and second output gates corresponding to said memory cell array portions;

said sense amplifiers comprise at least first, second, third and fourth sense amplifiers corresponding to said memory cell array portions;

said first and second sense amplifiers are connected to said first data bus, and said third and fourth sense amplifiers are connected to said second data bus; and positive-phase and negative-phase signal output terminals of said second sense amplifier are connected to respective positive-phase and negative-phase signal input terminals of said first output gate, positive-phase and negative-phase signal output terminals of said third sense amplifier are connected to the respective negative-phase and positive-phase signal input terminals of said first output gate, positive-phase and negative-phase signal output terminals of said fourth sense amplifier are connected to respective positive-phase and negative-phase signal input terminals of said second output gate, and positive-phase and negative-phase signal output terminals of said first sense amplifier are connected to the respective negative-phase and positive-phase signal input terminals of said second output gate;

a first mode of said output organization of output data is achieved by one of activating said first and second sense amplifiers while deactivating said third and fourth sense amplifiers, and deactivating said first and second sense amplifiers while activating said third and fourth sense amplifiers, a second mode of said output organization of output data is achieved by deactivating said first and third sense amplifiers while activating said second and fourth sense amplifiers.

* * * * *